Figure 1:
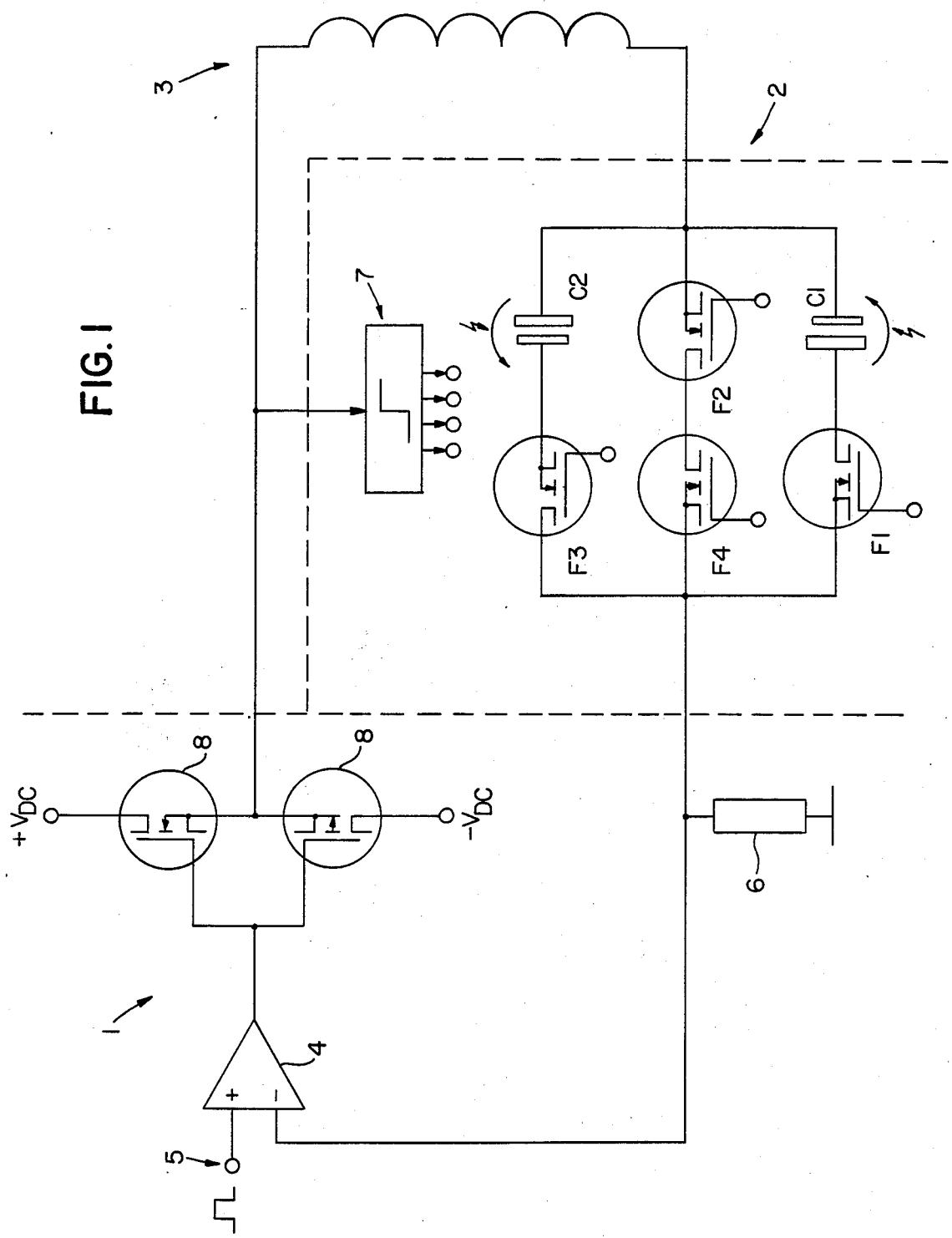

United States Patent [19]

Kupiainen

[11] Patent Number: 4,668,904
[45] Date of Patent: May 26, 1987

[54] CONTROLLED SOURCE OF CURRENT

[75] Inventor: Juhani Kupiainen, Espoo, Finland

[73] Assignee: Instrumentarium Corp., Finland

[21] Appl. No.: 601,952

[22] Filed: Apr. 19, 1984

[30] Foreign Application Priority Data

Apr. 22, 1983 [FI] Finland .................................. 831389

[51] Int. Cl.$^4$ ................................................ G05F 1/00
[52] U.S. Cl. .................................... 323/350; 323/351; 320/1; 307/109
[58] Field of Search ............... 323/293, 352, 268, 271, 323/349, 350, 351; 320/1; 307/4, 5, 109

[56] References Cited

FOREIGN PATENT DOCUMENTS 3112280 10/1982 Fed. Rep. of Germany .

OTHER PUBLICATIONS

P. A. Bottomley, Rev. Sci. Instrum., 53 (9), Sep. 1982, pp. 1319–1337.
C-M Lai et al, Chem., Biomed., Environ. Instrumentation, 9(1), 1-27, 1979, pp. 1-27.
J. M. S. Hutchinson et al., J. Phys., E.: Sci. Instrum., vol. 11, 1978, pp. 217-221.

Primary Examiner—Peter S. Wong
Assistant Examiner—Judson H. Jones
Attorney, Agent, or Firm—Andrus, Sceales, Starke & Sawall

[57] ABSTRACT

The invention relates to a controlled source of current (1) having an inductive load (3), particularly a gradient coil adaptable to a nuclear spin imaging assembly. In order to cut down the reversal time of a current flowing in the load, the circuit is provided, according to the invention, with controlled energy storage instruments (2) connected in series with source of current (1) and inductive load (3) for increasing the rate of conversion of energy stored in said inductive load (3). Said instruments (2) preferably comprise capacitor means (C1, C2) and switch means (F1 . . . F4) for controlling the capacitors, facilitating a quick transfer of energy into or out of load (3). Said switch means (F1 . . . F4) are controlled by means of instruments (6) sensing a current flowing in inductive load (3), the conversion of energy being thus accurately controlled.

5 Claims, 2 Drawing Figures

CONTROLLED SOURCE OF CURRENT

The present invention relates to a controlled source of current provided with an inductive load, particularly a gradient coil suitable for a nuclear spin imaging assembly.

Nuclear spin imaging is a novel, material non-disrupting imaging method, one of its most significant application being medical diagnostics. Fundamentals of nuclear spin imaging have been described e.g. in reference P. A. Bottomley: Rev. Sci. Instrum 53 (9) Sept. 1982. Nuclear spin imaging is based on the precession movement of atomic nuclei in an external magnetic field after first exciting them with a radio-frequency magnetic pulse. This precession can be controlled as a function of the location of an imaging target by means of magnetic field gradients. These field gradients are produced by feeding the currents into gradient coils, generally three in number and positioned orthogonally relative to each other. In the actual imaging event, the gradient coils are supplied with carefully timed current pulses which are subject to very strict requirements. The build-up time of current pulses must be short since the collection of a signal obtained from a target to be imaged cannot without special arrangements be started until the current has reached a sufficient constant value. A signal attenuates quickly after excitation and, thus, by cutting down the build-up time it is possible to improve the signal-to-noise ratio of a signal to be collected. During the signal collection, the field gradients must be kept steady as carefully as possible, since otherwise the signals obtained from different locations of an imaging target cannot be distinguished with sufficient accuracy from each other and the resulting image will be distorted. An image will be distorted even more than this if time integrals have even slight fluctuation from the control. In addition, the disturbances occurring in current pulses are directly coupled with a signal coil. During the signal collection, even slight coupling disturbances are undesirable since the signal to be collected is weak. In nuclear spin images, such disturbances are visible as additional figures which in practice rule out the use of such images in medical diagnostics.

In one prior art solution for embodying such a source of current, the current pulses are produced by coupling a charged capacitor by means of a thyristor with a load (J. M. S. Hutchinson, et. al.: J. Phys. E.: Sci Instrum., Vol. 11. 1978). The shape of a current pulse is determined on the basis of components coupled with the circuit. A drawback in this solution is that the pulses cannot be analogically controlled to achieve a desired shape but, instead, circuit components must be varied in order to reshape them.

Further, according to the prior art, it is conventional to produce current pulses by means of linearly functioning power semiconductors (e.g. C-M Lai et. al.: Chem., Biomed., Environ. Instrumentation 9 (1), 1–27, 1979). These semiconductors are connected in series with a load in a current path between supply voltage and ground level. In a bipolar source of current, the corresponding current control semiconductors are connected with both positive and negative supply voltage. The control of these semiconductors is often effected by using a current feedback, the current of a load being measured e.g. by means of a shunt resistance. A current backfed control circuit functions in a manner that the voltage of a shunt resistance corresponds as accurately as possible to the external control of a source of current. A drawback in such a conventional series regulator source of current is that, when using an inductive load, it is difficult to make the build-up time of a current pulse short enough. The short build-up time of a current pulse requires the supply of high voltage into the load for the reversal of current. This is why the supply voltage used in a circuit must be substantially higher than the voltage drop of a load when supplying even current. Thus, during the even and gently varying portions of current pulses, most of the voltage and power drop occurs in current control semiconductors. Therefore, the efficiency of a source of current is poor and the power supply connection of a device must be dimensioned to be quite heavy-duty. In addition, the current control semiconductors are required of extremely great power and voltage stability. When using a high supply voltage, also a circuit controlling current control semiconductors must function within a wide voltage range, the control thus being difficult to make sufficiently accurate. This is why it is often necessary to utilize a control circuit that is complicated and provided with special components.

Further known in the art is a solution set out in publication DE No. (OS) 3112280 for embodying a source of current. This solution employs two positive, ground level-bound supply voltages, one of them being substantially higher in voltage. These supply voltages can be alternately connected to one of the terminals of a load by means of semiconductor switches. The other terminal of a load is fitted with current control semiconductors through which the current passes to earthing level. For bipolar operation, the corresponding solid state switches and current control semiconductors must be connected to both terminals of a load. A short build-up time of current pulses is achieved in this solution in a manner that for the reversal of current the load is connected to a higher supply voltage. During the even portions of current pulses the use is made of lower supply voltage in order to reduce efficiency losses. The current control semiconductors serve to regulate the load so as to match the external control of current and the control of such semiconductors is achieved by using a current feedback.

On the other hand, this prior art solution involves the following drawbacks. When one of the terminals of a load is connected with solid-state connectors to a higher supply voltage, this voltage will also connect with the current control semiconductors in the same terminal of a load. Thus, such semiconductors are required of great voltage stability or durability. The control semiconductors dimensioned for high voltage have usually poor current durability and, thus, it is necessary to shunt connect a large number of semiconductors. A difficulty is also the isolation of the circuits controlling these current control semiconductors from high voltage. In several applications, the control circuits are isolated from an external control signal by means of an optoisolator. Also the measuring circuits of current feedback must be isolated from a load. Due to these isolations, it is extremely difficult to achieve sufficient accuracy for current pulses and a sophisticated control circuit will be required. In a bipolar source of current, the current control semiconductors regulating the opposing currents are connected to different terminals of a load and, therefore, the control thereof must be effected by using two separate control circuits. The provision of these control circuits is further complicated by the fact that, when reversing a current, it is necessary to reverse the current path by means of both solid-state connectors and current control semiconductors. In order to make the current pulses sufficiently accurate, the state variations of solid-state connectors and adjustment of current control semiconductors must take place sufficiently quickly. However, the circuits must function in a manner that not even for an instant does the current pass through the solid-state connectors and current control semiconductors connected to the same terminal of a load. Such a current would cause a great power loss in semiconductors, further magnified by current feedback. Thus, it is possible that even power semiconductors having oversized power durability might perish. Thus, in this solutions, the control circuits are subject to especially strict requirements. A further problem is caused by switching disturbances resulting from the state variations of solid-state connectors. When reversing the current, no current must flow in current control semiconductors which is why the impedance between a load and earth level is temporarily high. Thus, connection of a load to the supply voltage produces disturbance currents, said currents being determined by stray couplings between a load and its ambience and are thus irregular. For example, in the gradient coil of a nuclear spin imaging apparatus, such disturbances occasionally change the time integrals of current pulses and so mess up the imaging process.

An object of the invention is to provide a novel, simple-design controlled source of current in which the drawbacks found in the prior art solutions have been eliminated. As for its characteristics or properties, the device is particularly suitable for use as the gradient current source of a nuclear spin imaging apparatus and, furthermore, it is substantially more economical than corresponding prior art solutions.

A controlled source of current according to the invention is characterized in that, series connected with a source of current and an inductive load, the circuit is provided with controlled, energy-conserving means to increase the rate of conversion of the energy stored in said inductive load. Said means may preferably comprise capacitor means and switch means, adapted to supply said inductive load with a short voltage pulse when a current flowing in said inductive load is to rapidly increase its absolute value and, when a current is to remain constant or reverse slowly, said switch means are adapted to direct the current path past said capacitor means.

By means of an additional voltage pulse to be fed into a load the interpolar voltage of a load can be made higher for the reversal of a current. By virtue of a high voltage, the inductive energy transfers into a load quickly so as to achieve a very short build-up time for current pulse. Since an additional voltage pulse is used for producing a high voltage required for the period of quick current build-up, the service voltage of a linear current control circuit can only be measured on the basis of the resistive voltage drop of a load. Thus, it is possible to apply in a linear current control circuit a low-voltage input power, the voltage and power drops of current control semiconductors becoming very small. Also, the power drop encountered in the energy-conserving means is minor since an additional voltage pulse is connected to the circuit by means of solid-state connectors, whose impedance in the conducting state is low. Furthermore, as a current is quickly turning to a lower absolute value, energy can be returned into the capacitors of energy storage means for still decreased power consumption. The small power losses encountered in a linear current control circuit and said energy storage means offer several advantages: the power input circuits of a device can be designed to be low-power, the power consumption of a device is low, the current control semiconductors need not have great power durability, and sufficient cooling of active components is readily achieved.

The energy storage means are series connected with an inductive load, so the high voltage of an additional voltage pulse does not connect to linearly functioning current control semiconductors or to the control circuits thereof. Therefore, the current control semiconductors employed need not be semiconductors designed for high voltage, whose current durability is generally poor. Hence, sufficiently current values can be reached with a small number of active components. As the high voltage to be supplied into a load does not connect to the current measuring circuit of a current feedback either, the linear current control can be effected entirely low-voltaged and without isolations. By virtue of this, the source of current serves to achieve highly controllable current pulses even by using a very simple control circuit. Also the disturbance level of a device can be made low since the state variations of solid-state connectors will not occur during the even and slowly reversing sections of current pulses. When a current is to reverse quickly, the connection of an additional voltage pulse is effected in a manner that the impedance between a load and earth level is continuously low. This is why the occasional disturbance currents caused by the state variations of said connectors or switches in a load are even then quite insignificant.

The switches that are part of energy storage instruments are controlled by employing means for sensing the current flowing in an inductive load. Such means or instruments may include a shunt resistance connected with the circuit or a sensor for sensing a magnetic field provided by said inductive load. By virtue of this solution, the setting time of a current flowing in the load can be made optimally short and the time integral of a current will be accurate also in quick current reversals. The setting time of a current and accuracy of the time integrals of a current are of critical significance especially in the gradient coil of a nuclear spin imaging apparatus.

Another advantage gained by a source of current of the invention is that the energy storage instruments may comprise a separate accessory to be connected with a conventional source of current.

Figure 2:
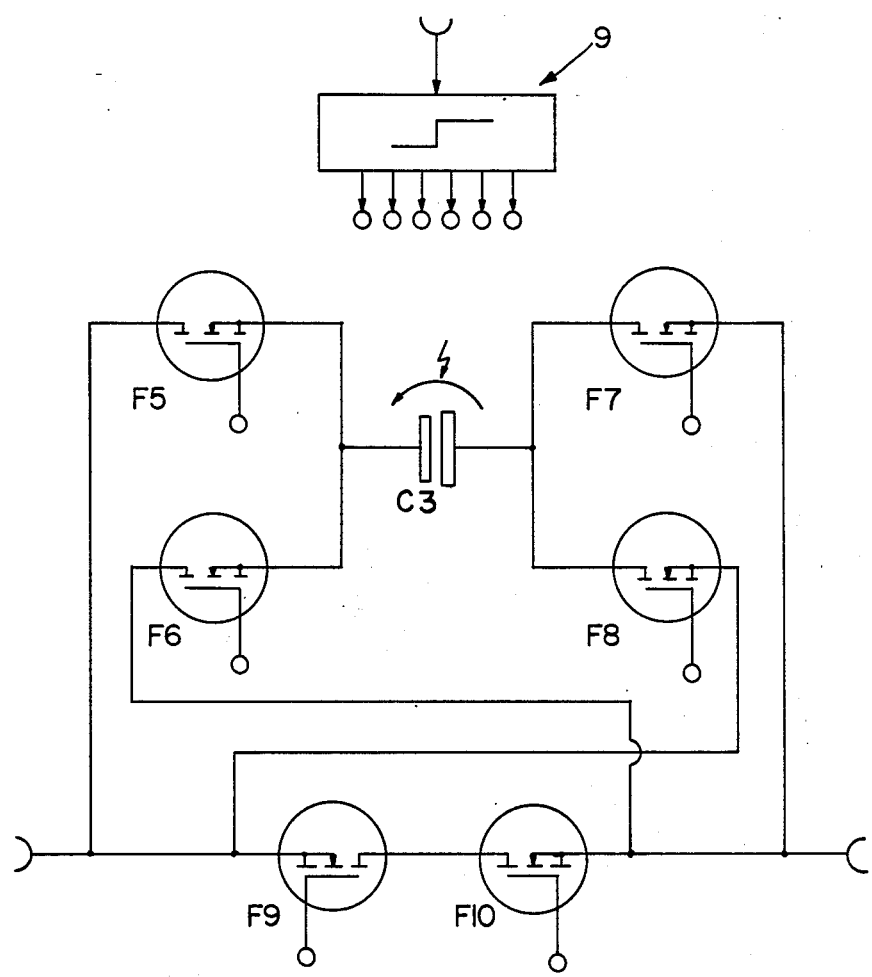

The invention will now be described in more detail with reference made to the accompanying drawing, in which FIG. 1 shows a circuit diagram of one embodiment of a source of current of the invention, FIG. 2 shows the connection of one alternative embodiment of energy storage instruments.

Referring to the drawing, the device is provided with a low-voltage source of current 1 as well as an inductive load 3, e.g. the gradient coil of a nuclear spin imaging apparatus. Connected in series with these are energy storage instruments 2. In this embodiment, the low-voltage source of current is provided with current control semiconductors 8, connected with supply voltages $V_{DC}$. Current control semiconductors 8 are controlled by a differential amplifier 4 which is connected, in addition to an external control voltage 5, with a shunt resistance 6 for providing a current feedback. Energy storage instruments 2 comprise, in the embodiments shown in the drawing, capacitors C1 ... C3 chargeable to high voltage as well as solid-state switches F1 ... F10. The solid-state switches are controlled by two-condition comparator circuits 7 and 9. The control utilizes means for sensing a current flowing in inductive load 3, said means in this embodiment comprising a shunt resistance 6.

The purpose of a low-voltage source of current as part of a device of the invention is to feed current into an inductive load whenever the current need not reverse quickly. Thus, said low-voltage source of current can be embodied in several ways. The embodiment shown in the accompanying drawing utilizes a conventional current feedback series regulator source of current, whose service voltages are low. The following description deals with the operation of such a series regulator source of current as connected with an inductive load without energy storage instruments. As pointed out, this is known in the prior art. Following this is a description of the operation of a device of the invention when provided with such low-voltage source of current.

In the low-voltage source of current 1 of FIG. 1, said current control semiconductors 8 comprise power MOSFET transistors. For bipolar function, the circuit is provided with complementary functioning transistors 8, connected with both positive and negative supply voltage $V_{DC}$. These supply voltages set limits for the strength of voltage to be fed into load 3. Determined on the basis thereof is also the maximum of a current to be fed into load 3, since the current flowing in a load is directly proportional relative to the resistive voltage drop of a load. The impedance of load 3 has a further inductive component for limiting the rate of reversal of a current flowing the load. The rate of reversal $\partial i(t)/\partial t$ is determined on the basis of load inductance L and inductive voltage u(t) as follows:

$$\partial i(t)/\partial t = u(t)/L$$

Thus, supply voltages $V_{DC}$ set limits also for the rate of reversal of a current flowing in load 3.

When a current flowing in load 3 need not reverse quickly, said differential amplifier 4 controls current control semiconductors 8 in a manner that the voltage of shunt resistance 6 is approximately equal to the external control voltage 5. Since a current flowing in load 3 is directly proportional to the voltage of shunt resistance 6, said current can be controlled by means of external control voltage 5 linearly up to the above-mentioned maximum current. However, if external control voltage 5 changes quickly, feeding of a control matching current into an inductive load 3 would require feeding of a high voltage into the load. If the output voltage of a low-voltage source of current is not sufficient for this, it will set at its maximum until the control matching current is reached. If such rapid change of external control voltage 5 proceeds towards a diminishing absolute value, some of the energy charged in inductive load will transfer into supply voltage $V_{DC}$. This transfer takes place through reversed parallel diodes in the internal design of MOSFET power transistors 8 when the output voltage of low-voltage source of current 1 is at its maximum.

A device of the invention comprises energy storage instruments 2 which, in the embodiment of FIG. 1, are designed by using solid-state switches F1 ... F4 and capacitors C1 and C2, chargeable to high voltage. Solid-state switches are also MOSFET power transistors controlled, however, by means of two-condition comparator circuits 7. Thus, with a forward current, the solid-state switches operate as controllable switches and, with a backward current, they always conduct whenever voltage exceeds the barrier voltage of diode which is part of the internal design of said switches. Comparator circuits 7 receive their control from the output voltage of low-voltage source of current 1. When the variations of external control voltage 5 are slow, the output voltage of low-voltage source of current 1 does not reach the reference voltages at which comparator circuits 7 reverse their condition. The conditions of comparator circuits 7 are then such that a current flowing in load 3 bypasses capacitors C1 and C2. Thus, switches F2 and F4 are conducting and switches F1 and F3 are not. Thus, during the uniform and slowly varying sections of current pulses, said energy storage instruments 2 correspond to a low impedance in a current path and the device operates the same way as a mere low-voltage source of current.

When the external control voltage increases quickly to positive direction, the output voltage of a low-voltage source of current reaches its maximum. The reference voltages $u_{+\nu}$ of comparator circuits controlling solid-state switches F1 and F2 are slightly below this maximum voltage, so switches F1 and F2 reverse their condition. Thus, the current of load 3 passes through capacitor C1 and the voltage of capacitor C1 is added to the output voltage of low-voltage source of current 1. By virtue of the interpolar high voltage of a load, the load current rapidly increases to a value corresponding to the external control. After reaching this current value, the output voltage of low-voltage source of current 1 falls below reference voltage $u_{+\nu}$ as a result of current feedback. Then, switches F1 and F2 reverse their conditions and the current again begins to by-pass the capacitors. When external control voltage 5 increases rapidly in negative direction, the output voltage of low-voltage source of current 1 exceeds the same way the reference voltage of comparator circuits 7 controlling switches F3 and F4. Thus, switches F3 and F4 reverse their conditions and the load current will pass through capacitor C2 until the current value corresponding to external control voltage 5 is reached.

When the external control voltage changes rapidly towards a diminishing absolute value, said switches controlling comparator circuits 7 function the same way as when the control voltage changes rapidly towards a higher absolute value. However, a current flowing in capacitors C1 and C2 as well as in solid-state switches F1 and F4 will be reversed since, with the diminishing absolute value of a current flowing in the load, some of the energy will be transferred from the inductance of said load to the capacitors. In solid-state switches F1 and F4, the current will then flow through parallel diodes provided by their internal design.

If a unipolar source of current is employed as a low-voltage source of current, the current flowing in a load need not increase rapidly in negative direction. Thus, one of the capacitors fitted in energy storage instruments need not feed energy into the load. Hence, in this case, it can be replaced with a zener diode which, as the current rapidly decreases, converts some of the energy stored in an inductive load to heat. When zener voltage is selected to be high, the decreasing time of a current can be made short.

FIG. 2 shows an alternative embodiment of energy storage instruments 2, whose operation corresponds analogically to that of the embodiment shown in FIG. 1. The only difference is that in this case just one capacitor C3 is employed and this capacitor is connected in a current path reversibly depending on the reversing direction of a current.

The invention is by no means limited to the above embodiments but a plurality of modifications are conceivable within the scope of the annexed claims.

I claim:

1. A current source for the gradient coil of a nuclear spin imaging apparatus comprising:

a controllable current supply (1) connected to the coil (3) for providing current to the coil;

sensing means (6) for sensing the current flowing in the gradient coil and for providing an output in accordance therewith; and energy storage means (2) connected in series with said controllable current supply and the coil, said energy storing means being responsive to the output of said current sensing means for increasing the rate of conversion of the energy stored in the gradient coil.

2. A current source as set forth in claim 1 wherein said energy storage means comprises capacitive means C1, C2, C3 for discharging energy to, and receiving energy from, the coil; and switch means 7, F1–F10 responsive to the output of said current sensing means, said switch means connecting said capacitive means to the coil for rapidly altering the current level in the coil and disconnecting said capacitive means from the coil and maintaining a current path through said energy storage means at other times.

3. A current source as set forth in claim 1 wherein said capacitive means comprises a first capacitor C1 for altering current flow in one direction through the coil and a second capacitor C2 for altering current flow in the other direction through the coil, said switch means 7, F1–F4 connecting one or the other of said capacitors to the coil for altering the current level in the coil.

4. A current source as set forth in claim 2 wherein said capacitive means comprises a capacitor C3 and wherein said switch means 7, F5–F10 is formed for reversably connecting said capacitor to the coil for altering the level of current in either flow direction through the coil.

5. A current source as set forth in claim 1 wherein said current sensing means is coupled to said controllable current supply for controlling the output voltage of said supply, and wherein said sensing means is further defined as coupled to said controllable current supply and responsive to the output voltage thereof.

* * * * *